United States Patent
Jensen et al.

(10) Patent No.: US 7,804,135 B2
(45) Date of Patent: Sep. 28, 2010

(54) INTEGRATED SEMICONDUCTOR DIODE ARRANGEMENT AND INTEGRATED SEMICONDUCTOR COMPONENT

(75) Inventors: Nils Jensen, München (DE); Andreas Meiser, München (DE)

(73) Assignee: Infineon Technologies AG, Neubiberg (DE)

( * ) Notice: Subject to any disclaimer, the term of this patent is extended or adjusted under 35 U.S.C. 154(b) by 128 days.

(21) Appl. No.: 11/042,928

(22) Filed: Jan. 25, 2005

(65) Prior Publication Data

US 2005/0189564 A1    Sep. 1, 2005

(30) Foreign Application Priority Data

Jan. 30, 2004    (DE) .................. 10 2004 004 862

(51) Int. Cl.
*H01L 23/62* (2006.01)
(52) U.S. Cl. .................. 257/360; 257/361; 257/197; 257/E29.026
(58) Field of Classification Search .................. 257/360, 257/361, 197, E29.026
See application file for complete search history.

(56) References Cited

U.S. PATENT DOCUMENTS

| | | | |
|---|---|---|---|
| 5,627,715 A | 5/1997 | Brokaw | |
| 6,410,965 B1 * | 6/2002 | Yu | ............................. 257/356 |
| 7,064,393 B2 * | 6/2006 | Mergens et al. | ............ 257/360 |
| 7,098,509 B2 * | 8/2006 | Zdebel et al. | ................ 257/355 |

FOREIGN PATENT DOCUMENTS

| | | |
|---|---|---|
| DE | 27 07 870 | 4/1983 |
| EP | 0 926 740 | 6/1999 |
| EP | 1 193 766 | 4/2002 |

* cited by examiner

*Primary Examiner*—Howard Weiss
(74) *Attorney, Agent, or Firm*—Dicke, Billig & Czaja, PLLC (57) ABSTRACT

An integrated semiconductor diode arrangement is provided. The arrangement includes an anode region and a cathode region that are formed in a semiconductor material region. The anode region has an arrangement of alternately occurring and directly adjacent first and second anode zones, which alternate in their conductivity type. The anode region furthermore has a first particular anode zone of the second conductivity type, the lateral extent of which is comparatively larger than that of the further anode zones of the same conductivity type.

19 Claims, 9 Drawing Sheets

INTEGRATED SEMICONDUCTOR DIODE ARRANGEMENT AND INTEGRATED SEMICONDUCTOR COMPONENT

CROSS-REFERENCE TO RELATED APPLICATIONS

This Utility Patent Application claims priority to German Patent Application No. DE 10 2004 004 862.2, filed on Jan. 30, 2004, which is incorporated herein by reference.

BACKGROUND

The invention relates to an integrated semiconductor diode arrangement and to an integrated semiconductor component using the integrated semiconductor diode arrangement according to the invention.

In many technical devices, and precisely in the field of controlling power circuits, protection structures prevent the electronic circuits from being loaded by electrostatic discharges, namely so-called ESD loads. For this purpose, high-voltage diodes are used as freewheeling diodes, for example. In this case it is often necessary to implement additional measures in order to protect these protection elements themselves and/or in order to be able to integrate the protection elements and the production thereof in existing production concepts and structures.

For this and other reasons, there is a need for the present invention.

SUMMARY

The present invention is an integrated semiconductor diode arrangement. The arrangement includes an anode region and a cathode region that are formed in a semiconductor material region. The anode region has an arrangement of alternately occurring and directly adjacent first and second anode zones, which alternate in their conductivity type. The anode region furthermore has a first particular anode zone of the second conductivity type, the lateral extent of which is comparatively larger than that of the further anode zones of the same conductivity type.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the invention provides an integrated semiconductor diode arrangement that can be integrated or can be formed in integrated fashion in existing production technologies, for example of the BCD (Bipolar CMOS DMOS) type, with a low outlay and with robust ESD protection properties.

The integrated semiconductor diode arrangement according to one embodiment of the invention has an anode region essentially of a first conduction type or first conductivity type. Furthermore, a cathode region of a second conduction type or conductivity type different from the first conduction type or conductivity type is provided. The anode region and the cathode region are formed in a semiconductor material region and are arranged in a first extension direction. In one case, the anode region is provided at the very top. According to one embodiment of the invention, the anode region has an arrangement in at least one second extension direction, for example in a cross section, of alternately occurring first and second anode zones of the first conduction type or first conductivity type and of the second conduction type or second conductivity type, respectively, which are directly adjacent to one another. The anode region has, as part of the arrangement of the anode zones, a first particular anode zone of the second conduction type or of the second conductivity type. Said zone has a comparatively larger, in particular lateral extent than the further anode zones of the anode region of the same conduction type or the same conductivity type. Moreover, said first particular anode zone is provided, arranged and/or formed in such a way that it serves, during an operating mode with electrostatic or ESD loading, as an emitter region of an npn-transistor formed in parasitic fashion in the integrated diode arrangement.

In this way, the anode region and, in particular, the arrangement of the anode zones have a first particular anode zone of the second conduction type or of the second conductivity type. Said zone is provided, arranged and/or formed in such a way that it serves as an emitter region of the bipolar transistor or npn-transistor formed in parasitic fashion in the case of ESD loading.

It thus becomes possible, in one embodiment, for an integrated semiconductor diode arrangement with a robust ESD protection structure to be provided in a manner integrated in particular technologies.

In one embodiment, second particular anode zone of the first conduction type or of the first conductivity type is provided, arranged and/or formed adjacent to the first particular anode zone. In this way, it serves as a base region or as a base terminal region of the bipolar transistor, for example npn-transistor, formed in parasitic fashion in the integrated diode arrangement. Thus, in the case of this embodiment, a second particular anode zone of the first conduction type or of the first conductivity type is provided, adjacent to the first particular anode zone. Said second particular anode zone is provided, arranged and/or formed in such a way that it serves as a base region or a base terminal region of the npn-transistor formed in parasitic fashion in the integrated diode arrangement.

In addition or as an alternative, additional zones of the first conduction type or of the first conductivity type may be provided, arranged and/or formed below the anode zones of the arrangement of the anode region and also below the second particular anode zone in such a way that a comparatively low base bulk resistance of the npn-transistor formed in parasitic fashion in the integrated diode arrangement can be set or is set by means of said zones.

As an additional or alternative measure, in the case of this example, additional zones of the first conduction type or of the first conductivity type are provided, arranged and/or formed below the anode zones of the arrangement of anode zones and also below the second particular anode zone in such a way that they bring about the formation of a comparatively low base bulk resistance of the npn-transistor formed in parasitic fashion in the integrated semiconductor diode arrangement.

In accordance with another embodiment of the integrated semiconductor diode arrangement according to the invention, it is provided that the formation of the comparatively low base resistance has been or is achieved in particular by virtue of the fact that the dopant concentration of the additional zones of the first conduction type or of the first conductivity type is chosen to be higher than the dopant concentration in an embedding well zone provided, which accommodates the further anode zones of the anode region.

In another refinement of the integrated semiconductor diode arrangement according to the invention, it is provided that the first particular anode zone has a lateral extent which is at least approximately twice as large as the lateral extent of the further anode zones of the anode region.

With regard to the geometrical arrangements of anode region and cathode region, various possibilities result by way of the corresponding selection possibilities with regard to the first and second extension directions.

In accordance with another embodiment, it is provided that the first extension direction is a lateral extension direction, for example with respect to the semiconductor material region in which the integrated semiconductor diode arrangement is formed, or with respect to a surface region thereof. As an alternative, the first extension direction may also be a correspondingly vertically chosen extension direction.

In another additional or alternative embodiment of the integrated semiconductor diode arrangement, it is provided that the second extension direction is a lateral extension direction, with respect to the semiconductor material region in which the integrated semiconductor diode arrangement is formed, or with respect to a surface region thereof. In this case, too, a vertical orientation of the second extension direction is formed as an alternative.

In one embodiment, in the structure of the integrated semiconductor diode arrangement, the first extension direction and the second extension direction are identical and are oriented laterally, so that the anode region and the cathode region are formed adjacent to one another and next to one another laterally.

In one embodiment of the integrated semiconductor diode arrangement according to the invention, it is provided that the arrangement of the anode zones has an alternating sequence of three to ten anode zones.

In accordance with another embodiment of the integrated semiconductor diode arrangement, the anode zones are formed such that they are essentially concentric in relation to one another, in particular with respect to their respective basic area and/or with respect to the second extension direction.

In one embodiment, the first particular anode zone of the second conduction type or of the second conductivity type is formed as a central or centrally located zone with respect to the arrangement of the anode zones.

As an alternative to this, as the first particular anode zone of the second conduction type or of the second conductivity type is formed, a peripheral or peripherally located zone is formed with respect to the arrangement of the anode zones.

Various embodiments are appropriate with regard to the shaping of the first and second anode zones and the particular anode zones, which embodiments can also be combined with one another.

In one embodiment of the integrated semiconductor diode arrangement according to the invention, it is provided that each of the first and second anode zones and/or each of the first and second particular anode zones in each case has a basic area in the form of a circle, an ellipse or a rectangle, for example in the second extension direction.

The conduction types or conductivity types may also be selected and combined with one another in various ways.

In accordance with another embodiment, it is provided that the first conduction type or first conductivity type is a p-type, and that the second conduction type or second conductivity type is an n-type.

As an alternative to this, it is provided that the first conduction type or first conductivity type is an n-type, and that the second conduction type or second conductivity type is a p-type.

Figure 1A:
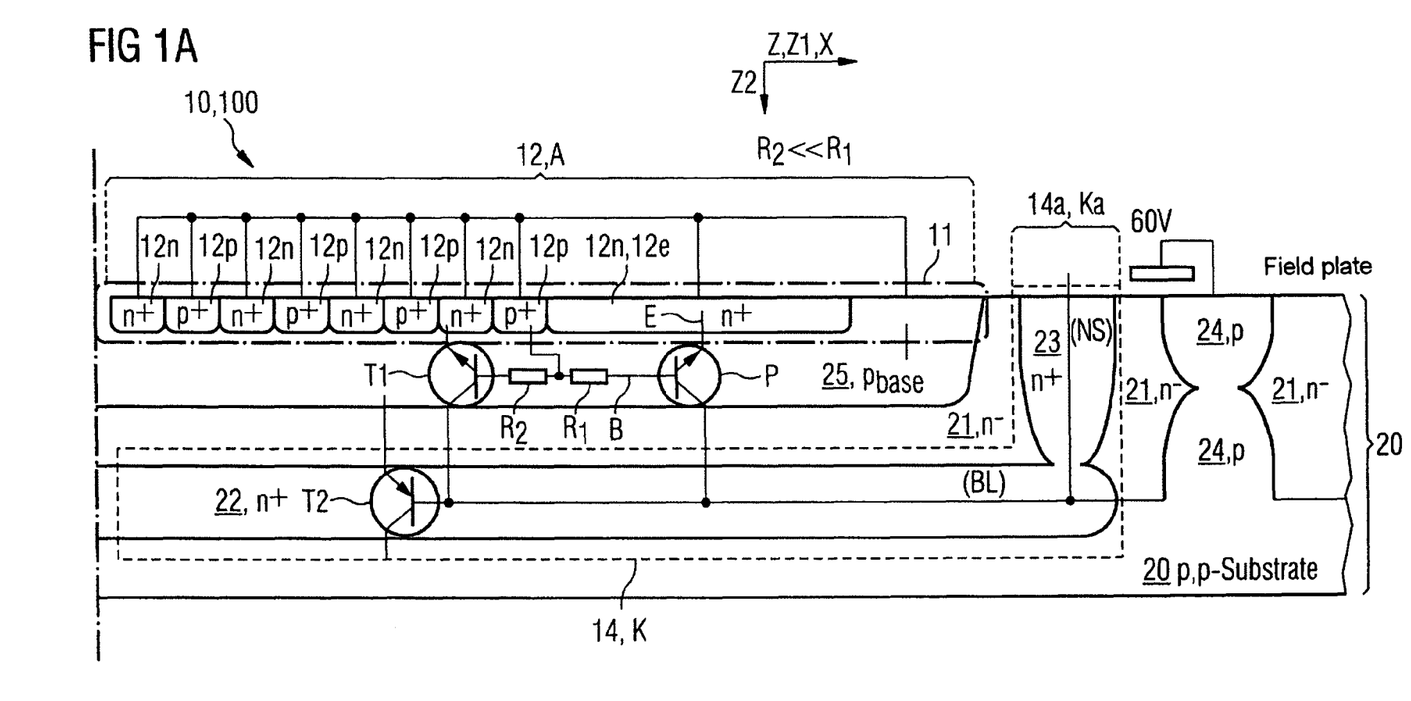
FIGS. 1A and 1B illustrate lateral cross-sectional views of alternative embodiments of the integrated semiconductor diode arrangement according to the invention.

It is thus possible to mutually interchange the first and second conduction types or conductivity types with regard to the n-type and the p-type. In accordance with this interchanging, the anode region and cathode region are then also interchanged in comparison with the structures illustrated in FIGS. 1A and 1B. Furthermore, in the corresponding embodiments formed by interchanging, a pnp-transistor is then also formed as a bipolar transistor in parasitic fashion.

Another embodiment of the present invention provides an integrated semiconductor component, in particular in a so-called BCD technology, in which an integrated semiconductor diode arrangement according to the invention is provided.

Figure 1B:
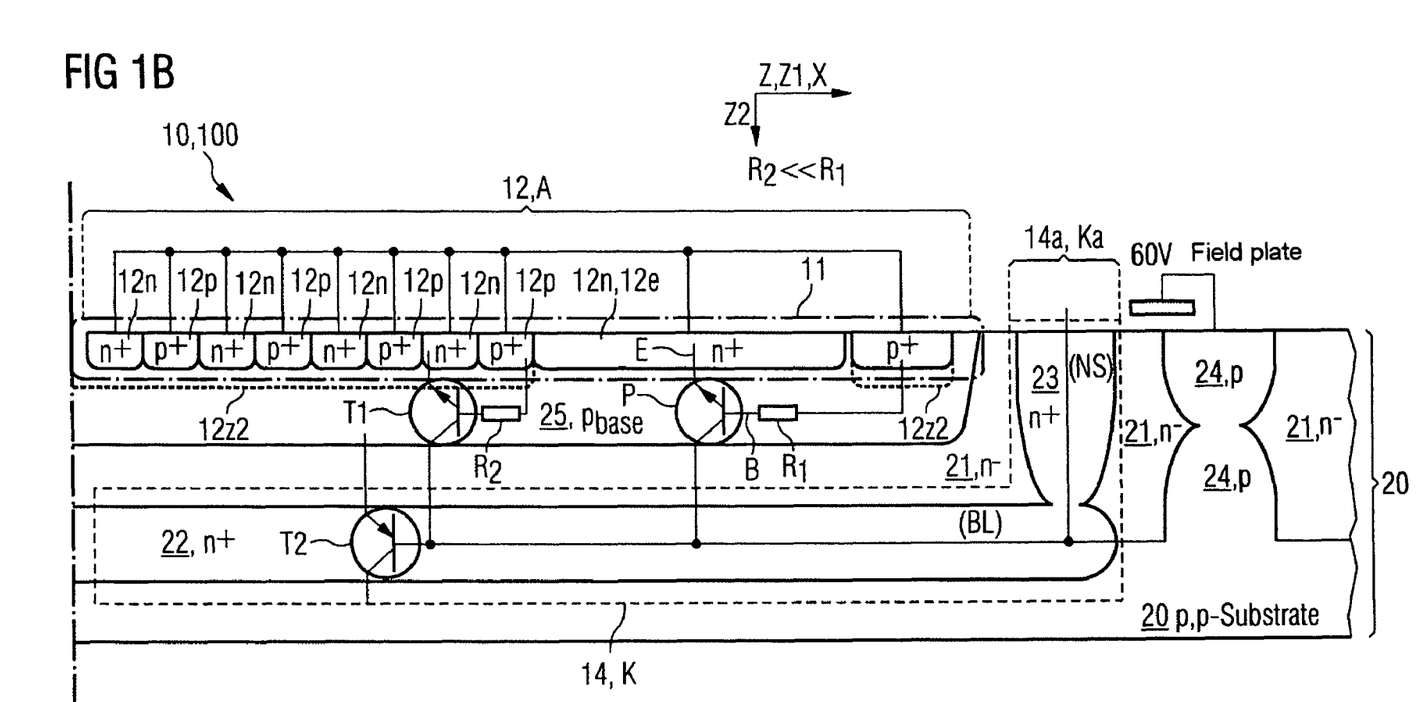

FIG. 1B illustrates one embodiment of an integrated semiconductor diode arrangement 10 according to the invention, which is used in an integrated semiconductor component 100 according to the invention.

The semiconductor diode arrangement 10 according to one embodiment of the invention is formed in a semiconductor material region 20 having an essentially planar surface region 20a. In the embodiment illustrated in FIG. 1, said semiconductor material region 20 is formed by a p-type substrate 20p in which various doping zones are formed. These doping zones are, on the one hand, $n^-$-doped epitaxial zones 21. Furthermore, a p-doped well zone 25 is formed for the anode region 12, A. This p-doped well region 25 reaches as far as the surface region 20a of the semiconductor material region 20. At the surface 20a, the well region 25 is formed by the arrangement 11 of the first and second anode zones 12p and 12n and also the first and second particular anode zones 12e and 12b, respectively.

The first anode zones 12n are $n^+$-doped. The second anode zones 12p are $p^+$-doped. The first particular anode zone 12e is likewise $n^+$-doped whereas the second particular anode zone 12b is $p^+$-doped.

A cathode region 14, K is formed adjacent to the anode region 12, A, and is functionally essentially formed by the n-doped zones 21, 22 and 23. As has already been explained in part above, the cathode or the cathode region 14, K may be interpreted as a functional unit of the interacting zones 21, 22 and 23. The zone 21 may also be interpreted as an $n^-$-doped epitaxial layer 21. The base line region 22 already mentioned above, with its $n^+$-type doping, may also be referred to as a buried layer 21 of the $n^+$-type. Finally, the zone 23 is likewise $n^+$-doped, also contributes to the mode of operation of the cathode 14, K, but is ultimately a zone 14a, Ka for contact-connection of the cathode region 14, K.

In this way, on account of the interaction of the zones 21, 22 and 23 and on account of their geometrical arrangement in relation to one another and in relation to the anode region 12, A, the anode region 12, A and the cathode region 14, K are arranged laterally and vertically with respect to one another, so that two first extension directions Z1 and Z2, namely laterally in the underlying semiconductor substrate 20 and vertically with respect thereto, are present.

The base line region 22 with $n^+$-type doping is provided below the anode region 12, A and spaced apart from the latter by the $n^-$-doped epitaxial layer 21, said base line region being connected to the cathode region 14, K. The p-type substrate 20p is connected, via p-doped zones 24 that are further provided, to a field plate structure for field shielding that reaches as far as the surface region 20a of the semiconductor material region 20.

On the one hand, the illustrated embodiment involves the presence of the first particular anode zone 12e of the second conduction type or conductivity type, that is, n-type doping. On the other hand, the illustrated embodiment involves the presence of a further particular anode zone 12b of the first conduction type or first conductivity type, that is, p-type doping.

During operation, in the event of ESD loading, the first particular anode zone 12e acts as an emitter region E for the npn-transistor P formed in parasitic fashion, whereas in this mode the further particular anode zone 12b serves as a corresponding base region B or base terminal region BA of the npn-transistor P formed in parasitic fashion.

In one embodiment, provision is made of the additional zones 12z1 and 12z2 of the first conduction type or conductivity type, that is, p-type doping, which are formed below the first and second anode zones 12n and 12p and below the second particular anode zone 12b.

The anode zones 12n, 12p, 12e and also 12b are arranged in a given extension direction X, that is, in the second extension direction, which is identical to the extension direction Z for the arrangement from anode region 12, A to cathode region 14, K, the latter corresponding to the first extension direction Z.

The embodiment illustrated in FIG. 1B has, besides the first particular and additional anode zone 12e, a further second and additional particular anode zone 12b and additional zones 12z1, 12z2 of the first conduction type p that are correspondingly provided in the lower region. The embodiment illustrated in FIG. 1A constitutes an alternative version of the integrated semiconductor diode arrangement 10 according to the invention. In this case, in accordance with one embodiment of the present invention, the second particular anode zone 12b and also the further zones of the first conduction type, namely with p-type doping, which are provided below the anode region 12a are not provided, so that the base line resistance R1 of the parasitic bipolar transistor P is formed in the path from the first additional anode zone 12e of the second conductivity type n to the directly adjacent, that is, preceding, anode zone 12p with $p^+$-type doping. However, functioning is nevertheless ensured thereby.

Figure 2:
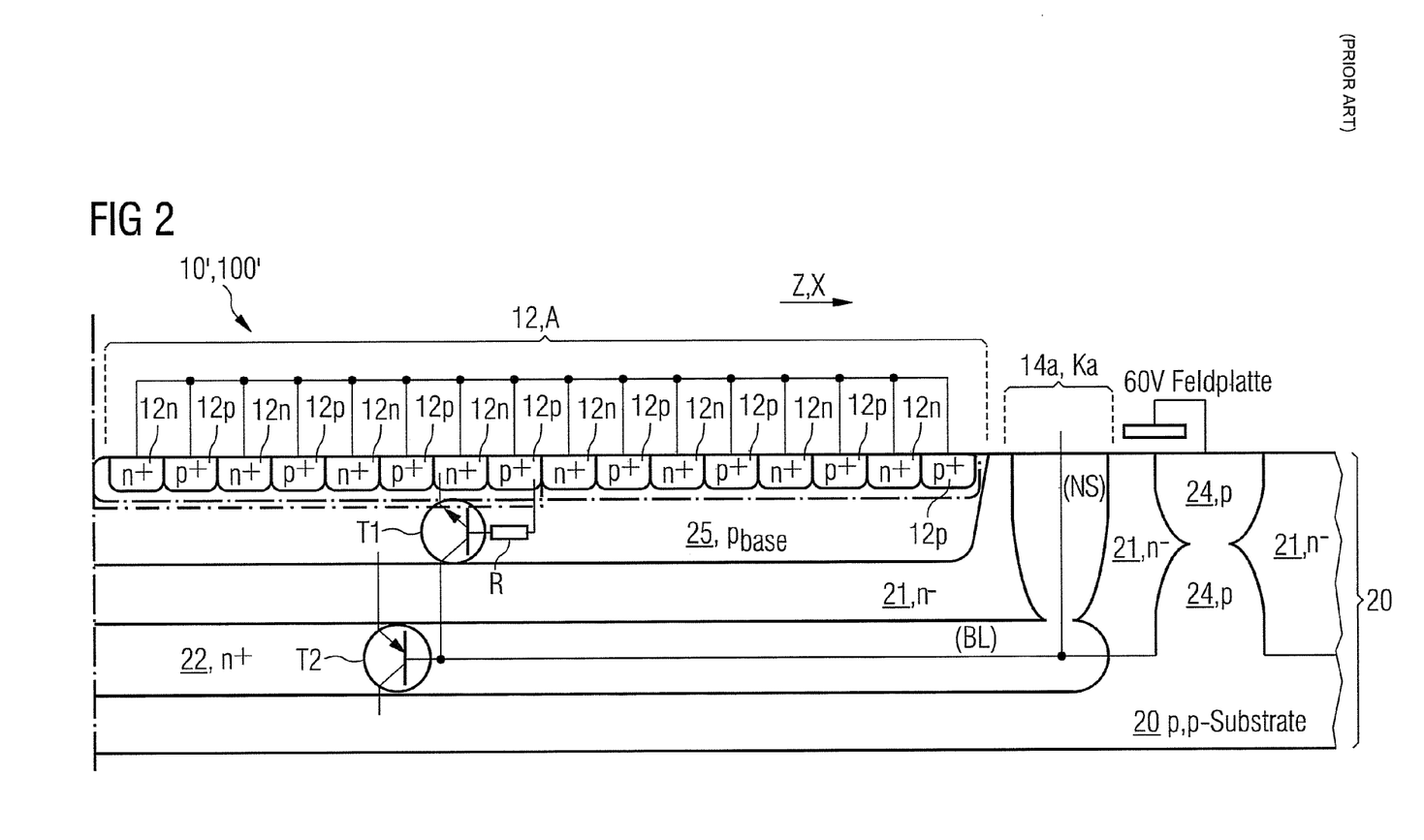
FIG. 2 illustrates a lateral cross-sectional view of an integrated semiconductor diode arrangement from the prior art.
Figure 3A:
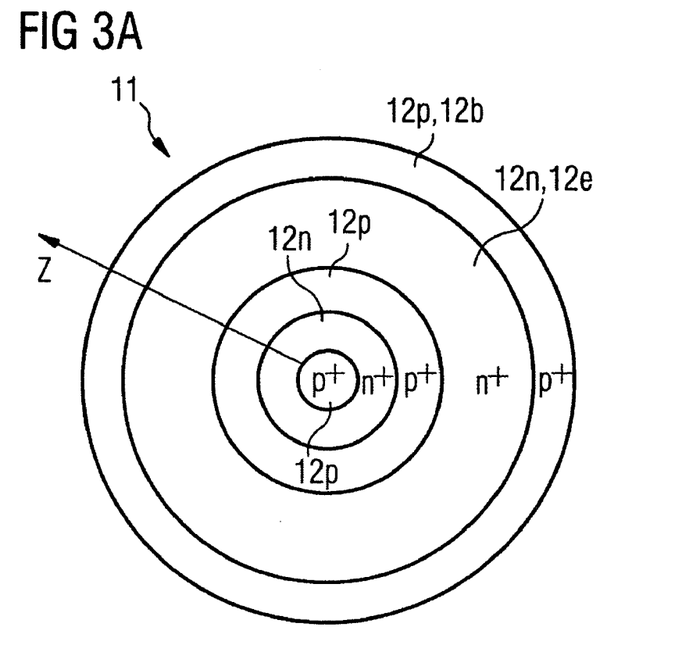
FIGS. 3A-F illustrate schematic plan views of anode regions of alternative embodiments of the integrated semiconductor diode arrangement according to the invention.
Figure 3B:
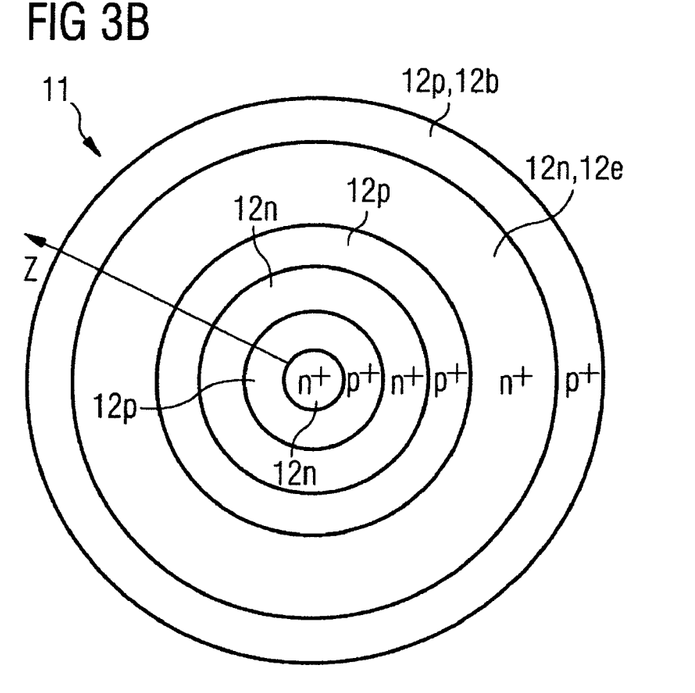
Figure 3C:
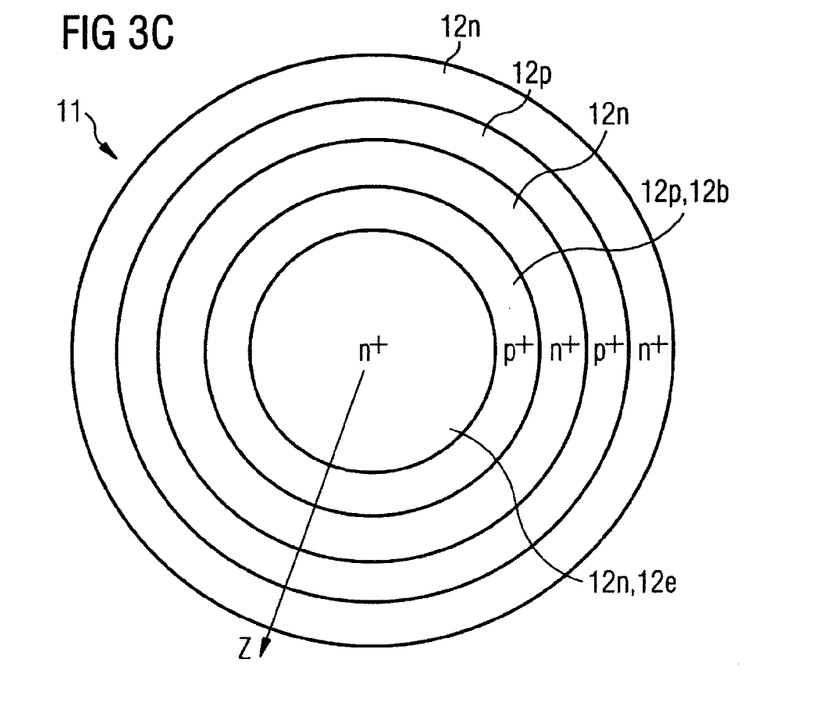
Figure 3D:
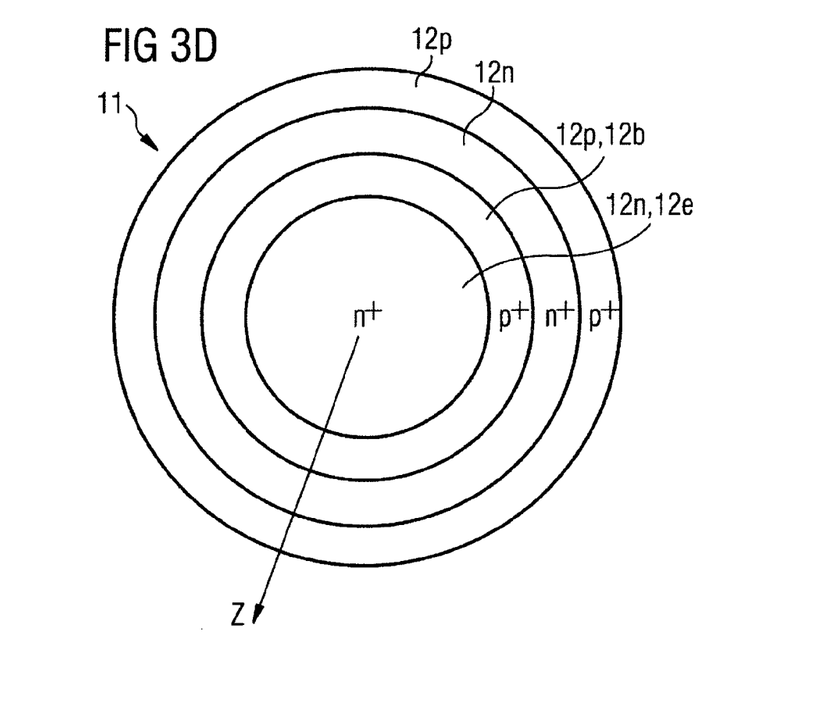
Figure 3E:
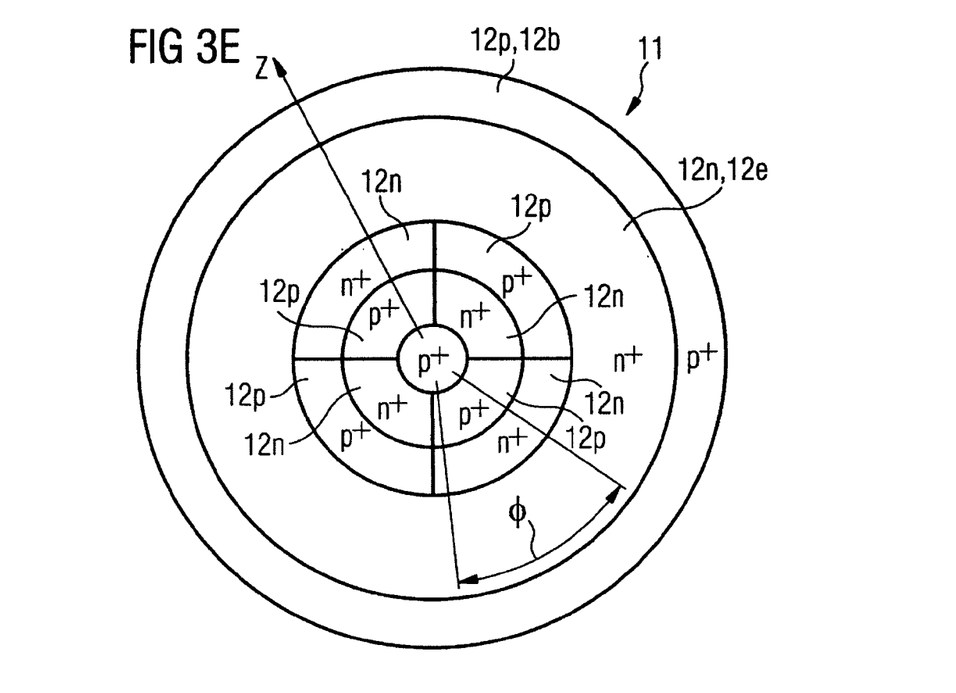
Figure 3F:
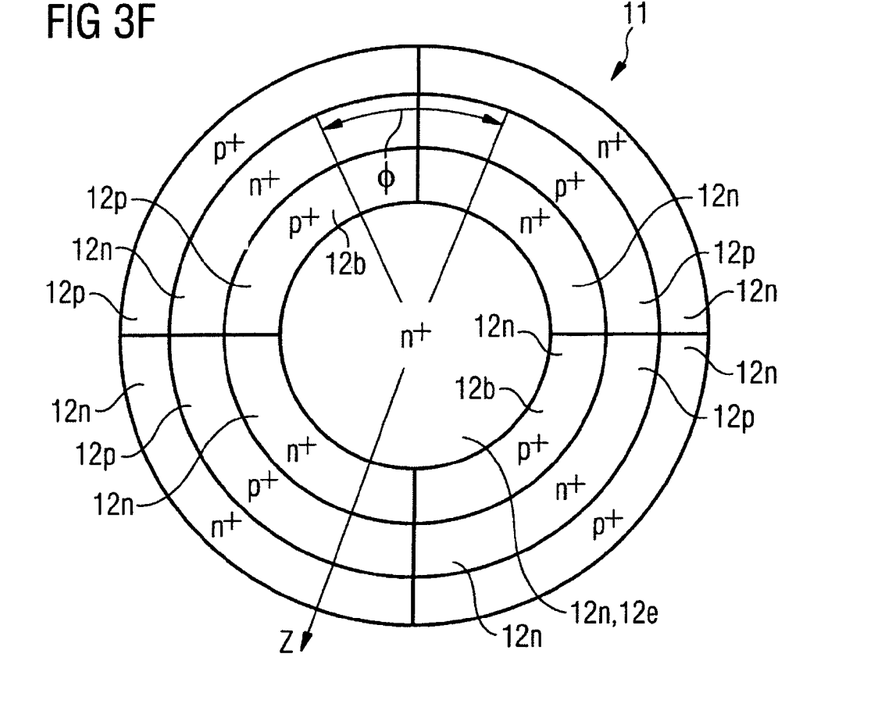
Figure 4A:
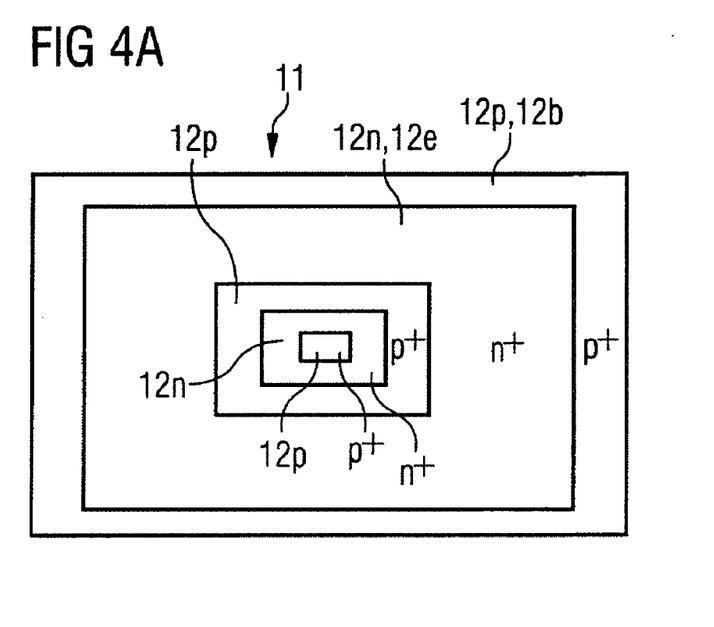
FIGS. 4A-D illustrate plan views of anode regions of alternative embodiments of the integrated semiconductor diode arrangement.
Figure 4B:
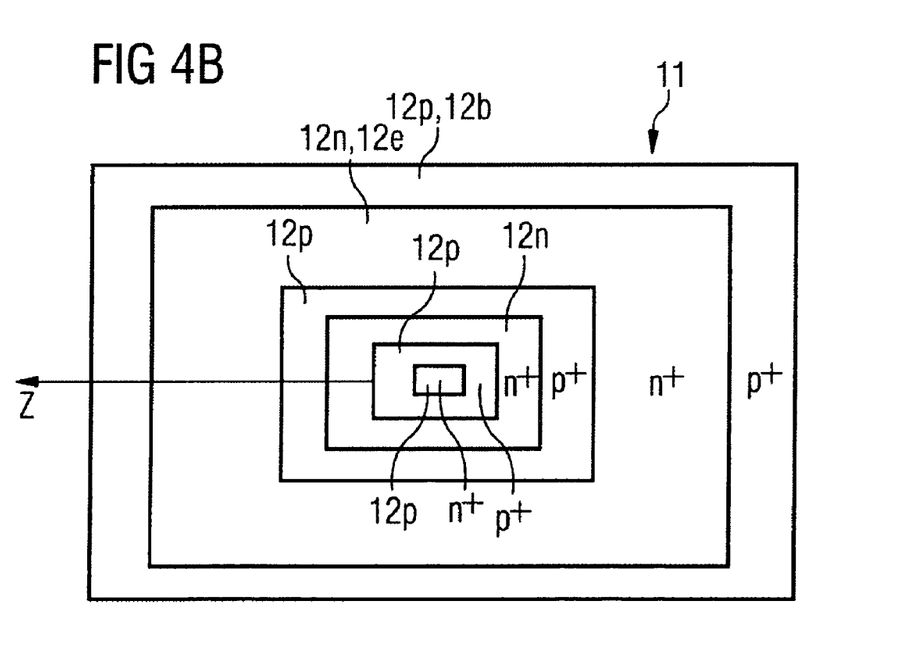
Figure 4C:
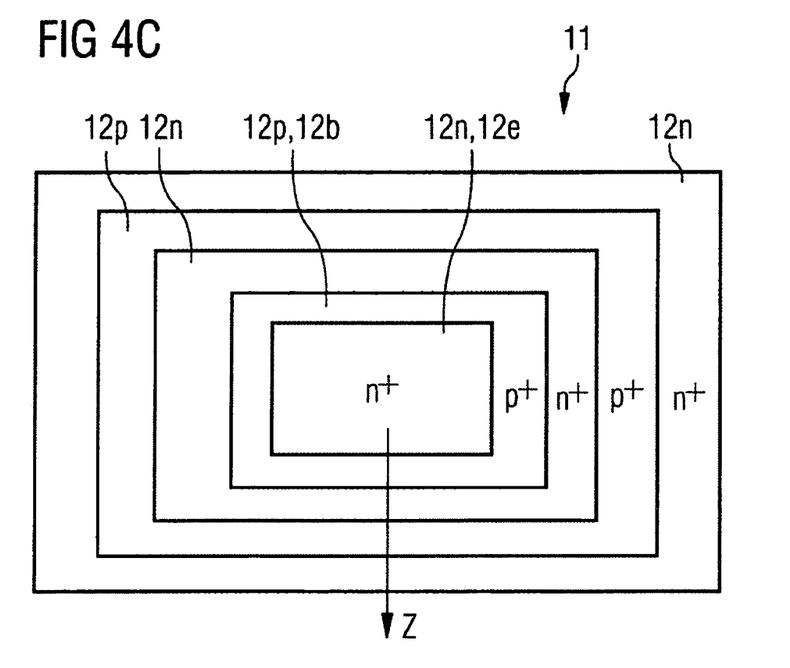
Figure 4D:
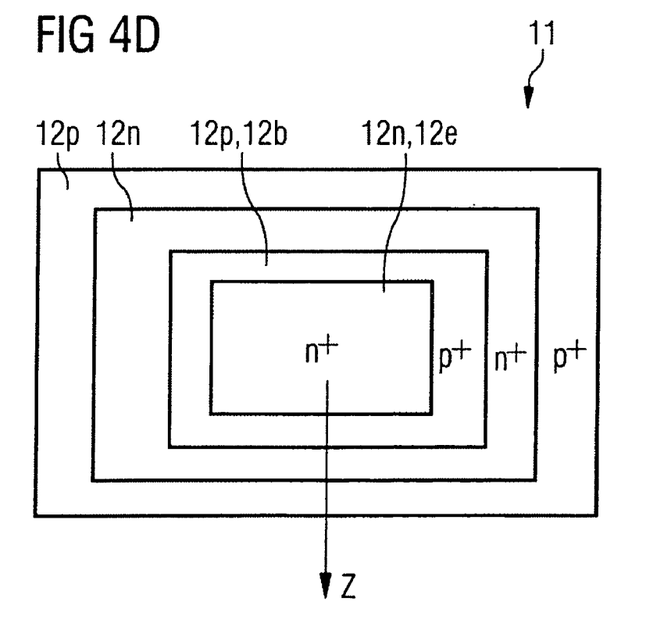

FIG. 2 illustrates a conventional integrated semiconductor diode arrangement 10' provided in a customary integrated semiconductor component 100'. Although a corresponding arrangement 11 of anode zones 12n and 12p for the anode region 12, A is also discernable here, there are absent here firstly the first particular anode zone 12e and the second particular anode zone 12b and moreover also the plurality of zones 1271, 1272 of the first conduction type or conductivity type, that is, zones with a p-type doping, below the arrangement 11.

FIGS. 3A to 3F illustrate schematic plan views of various arrangements 11 for anode zones 12n, 12p, 12e, 12b for the anode region 12, A of alternative embodiments of the integrated semiconductor diode arrangement 10 according to the invention.

In these embodiments, all first, second and particular anode zones 12n, 12p, 12e and 12b are formed as dopant zones that are concentric in relation to one another with respect to their basic area. In this case all the anode zones 12n, 12p, 12e and 12b are formed approximately circularly. The extension direction X for the sequence of the arrangement 11 of the anode zones 12n, 12p, 12e, 12b is in each case a radial direction here. The anode zones 12n, 12p, 12e, 12b are formed alternately with the dopings $p^+$ and $n^+$. In the case of the embodiments of FIGS. 3A, 3B and 3E, the first and second particular anode zones 12e and 12b are located peripherally, that is, as seen from the center of the arrangement 11, on the outer side. In the case of the embodiments of FIGS. 3C, 3D and 3F, by contrast, the first and second particular anode zones 12e and 12b are formed as centrally located doping zones. In the case of the embodiments of FIGS. 3E and 3F, in addition to the extension direction X for the alternating sequence of the arrangement 11 of the anode zones 12n, 12p, 12e, 12b there is additionally an azimuthal or angular direction φ for the inner or centrally located anode zones 12n, 12p and respectively for the anode zones 12n, 12p located on the outer side.

The embodiments of FIGS. 4A to 4D also exhibit concentric sequences for the arrangement 11 of the anode zones 12n, 12p, 12e, 12b, but here the anode zones 12n, 12p, 12e, 12b have a rectangular basic area in the lateral extension direction X. The first and second particular anode zones 12e and 12b are located peripherally in the case of the embodiments of FIGS. 4A and 4B whereas they are located centrally in the case of the embodiments of FIGS. 4C and 4D.

Various problem areas may be solved by various embodiments of the invention. Some problems are solved by the provision of the high-voltage diode or freewheeling diode according to various embodiments of the invention as a robust ESD structure, for example in BCD technology.

Figure 5:
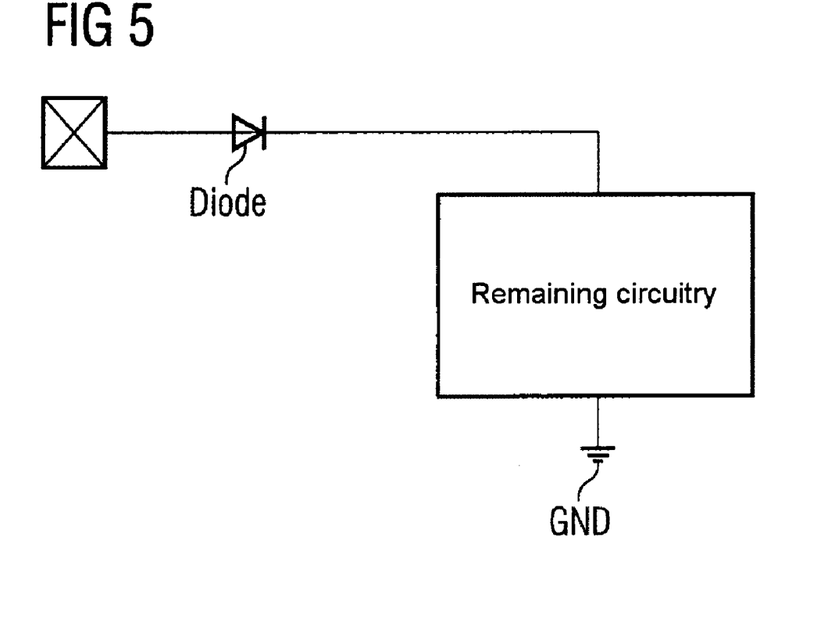
FIGS. 5-6 illustrate circuit diagrams of exemplary fields of application of the integrated semiconductor diode arrangement according to the alternative invention.

For example, polarity reversal protection of circuits requires a diode which, on the one hand, is ESD-resistant or ESD-protectable and, on the other hand, does not inject into the substrate in the case of negative voltages at the anode (see FIG. 5).

Figure 6:
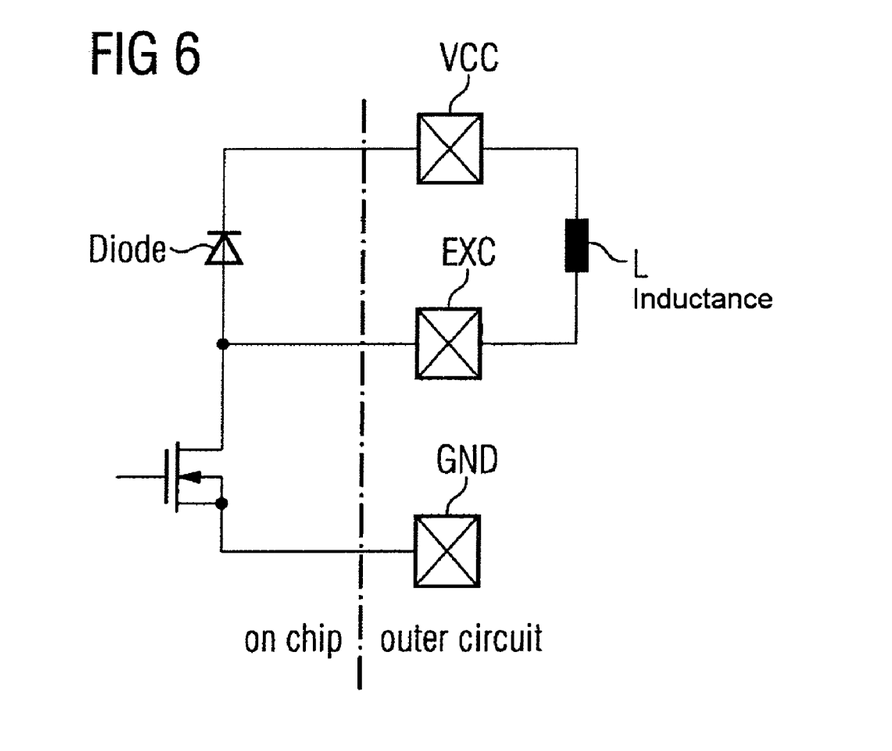

In the case of low-side switches with an inductive load, a diode as a freewheeling diode is inserted between two external pins (see FIG. 6).

When the output transistor is turned off, the freewheeling diode opens a current path for the decay of the current through the inductance. Thus, the high-voltage diode according to one embodiment of the invention has lower gain of the pnp-transistor in the substrate as a result of an additional npn-transistor. Since the freewheeling diode is connected between two external pins in parallel with the load, it must either itself be robust in order to withstand an ESD loading of VCC to EXC or be able to be protected by means of an ESD structure.

One embodiment of the invention describes an ESD structure in the form of a high-voltage diode with a low substrate current and short reverse recovery time. An external ESD protection or complicated guard ring constructions are thus invalid.

One embodiment of the invention provides the combination of an ESD diode with a high-voltage diode having a low substrate current with a short reverse recovery time in such a way that the ESD robustness and the diode behavior are preserved. In comparison with the construction of the high-voltage diode having a low substrate current with a short reverse recovery time (cf. FIG. 2), the new ESD-robust high-voltage diode differs in several ways. Besides the alternating arrangement of $p^+/n^+$-type zones in the anode zone there is a larger n-type zone which acts as an emitter of the parasitic npn-transistor in the event of ESD loading. Also, below the $n^+/p^+$-type zones in the anode zone and also below the optional additional $p^+$-type base terminal besides the larger n-type zone there are optionally additional p-type zones, which lead to the lowering of the base bulk resistance of the parasitic bipolar transistor, in particular npn-transistor. This ensures that the bipolar transistor, in particular npn-transistor with the larger n-type zone as emitter triggers first in the ESD case and accepts the current.

It is possible to generate electrothermally simulated 2 D current, field and temperature distributions of an ESD-robust high-voltage diode, for example, during a current ramp of 10 mA/μm in 5 ns. This current ramp reproduces the conditions of an ESD discharge. Current is transported via the parasitic npn-transistor with the larger n-type zone as emitter. After current loading of 100 ns, the result is an increase in the maximum temperature on account of the thermal loading as a result of the current pulse, but no movement of the current distribution in edge regions, which generally leads to the destruction of the component.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated semiconductor diode arrangement comprising:
    an anode region of a first conductivity type;
    a cathode region of a second conductivity type different from the first conductivity type;
    wherein the anode region and the cathode region are formed in a semiconductor material region and are arranged in a first extension direction;
    the anode region further comprising an arrangement in a second and lateral extension direction in a cross section of alternately occurring first and second anode zones of the first conductivity type and of the second conductivity type, respectively, which are directly adjacent to one another,
    wherein the arrangement of the anode zone has an alternating sequence of three to ten anode zones;
    the anode region further comprising as part of the arrangement of the anode zones a first particular anode zone of the second conductivity type, which has a comparatively larger lateral extent than the further anode zones of the anode region of the same conductivity type, wherein, the first particular anode zone is configured to serve, during operating mode with ESD loading, as an emitter region of a bipolar transistor formed in parasite fashion in the integrated diode arrangement and wherein the alternately occurring first and second anode zones and said first particular anode zone of the anode region that are directly adjacent to one another are short-circuited;
    wherein the first particular anode zone of the second conductivity type constitutes an outermost or innermost anode zone of the second conductivity type with respect to the arrangement of the second anode zones of the second conductivity type along the lateral extension direction and wherein the first particular anode zone is located at the center or border of the semiconductor diode arrangement.

2. The integrated semiconductor diode arrangement of claim 1, further comprising a second particular anode zone of the anode region and of the arrangement of the first conductivity type adjacent to the first particular anode zone in such a way that it serves as a base region of the bipolar transistor formed in parasitic fashion in the integrated diode arrangement 3. The integrated semiconductor diode arrangement of claim 2, further comprising:
    additional zones of the first conductivity type provided below the anode zones of the arrangement of the anode region and provided below the second particular anode zone such that a comparatively low base resistance of the bipolar transistor formed in parasitic fashion in the integrated diode arrangement can be set by means of said zones.

4. The integrated semiconductor diode arrangement of claim 3, wherein the dopant concentration of the additional zones of the first conductivity type is chosen to be higher than the dopant concentration in an embedding well zone provided, which accommodates the further anode zones of the anode region.

5. The integrated semiconductor diode arrangement of claim 4, wherein the first particular anode zone has a lateral extent that is at least twice as large as the lateral extent of the further anode zones of the anode region.

6. The integrated semiconductor diode arrangement of claim 5, wherein the first extension direction is a lateral extension direction, in particular with respect to a surface region of the semiconductor material region in which the integrated semiconductor diode arrangement is formed.

7. The integrated semiconductor diode arrangement of claim 5, wherein the first extension direction is a vertical extension direction, in particular with respect to a surface region of the semiconductor material region in which the integrated semiconductor diode arrangement is formed.

8. The integrated semiconductor diode arrangement of claim 5, wherein the second extension direction is a lateral extension direction, in particular with respect to the semiconductor material region in which the integrated semiconductor diode arrangement is formed.

9. The integrated semiconductor diode arrangement of claim 5, wherein the second extension direction is a vertical extension direction, in particular with respect to the semiconductor material region in which the integrated semiconductor diode arrangement is formed.

10. An integrated semiconductor component comprising:
an anode region of a first conductivity type;
a cathode region of a second conductivity type, that is different from the first conductivity type wherein the anode and cathode regions are formed in a semiconductor region and extend in a first direction;
first anode zones of a first conductivity type in the anode region;
second anode zones of a second conductivity type in the anode region, wherein the first and second anode zones of the anode region are laterally alternately occurring, directly adjacent to one another, short-circuited, and collectively form an arrangement extending in a second lateral direction;
means within the arrangement for serving as an emitter region of a bipolar transistor formed in parasitic fashion in the integrated semiconductor component, the means comprising a first particular anode zone that has a comparatively larger lateral extent than the first and second anode zones of the anode region, and that is laterally directly adjacent the first and second anode zones and provided alternately with these anode zones;
wherein the first particular anode zone of the second conductivity type constitutes an outermost or innermost anode zone of the second conductivity type with respect to the arrangement of the second anode zones of the second conductivity type along the lateral extension direction; and
wherein the first particular anode zone is located at the center or border of the integrated semiconductor component and wherein the first particular and second anode zones are not covered with an isolation layer.

11. The integrated semiconductor component of claim 10, wherein the first anode zones are configured to serve, during operating mode with ESD loading, as an emitter region of the bipolar transistor formed in parasite fashion in the semiconductor component.

12. The integrated semiconductor component of claim 11, further comprising a second particular anode zone of the anode region and of the arrangement of the first conductivity type adjacent to the first particular anode zone in such a way that it serves as a base region of the bipolar transistor formed in parasitic fashion in the semiconductor component.

13. The integrated semiconductor component of claim 12, further comprising:
additional zones of the first conductivity type provided below the anode zones of the arrangement of the anode region and provided below the second particular anode zone such that a comparatively low base resistance of the bipolar transistor formed in parasitic fashion in the integrated semiconductor component can be set by means of said zones.

14. The integrated semiconductor component of claim 13, wherein the dopant concentration of the additional zones of the first conductivity type is chosen to be higher than the dopant concentration in an embedding well zone provided, which accommodates the further anode zones of the anode region.

15. The integrated semiconductor component of claim 14, wherein the first particular anode zone has a lateral extent that is at least twice as large as the lateral extent of the further anode zones of the anode region.

16. The integrated semiconductor component of claim 15, wherein the first extension direction is a lateral extension direction, in particular with respect to a surface region of the semiconductor material region in which the integrated semiconductor component is formed.

17. The integrated semiconductor component of claim 15, wherein the first extension direction is a vertical extension direction, in particular with respect to a surface region of the semiconductor material region in which the integrated semiconductor component is formed.

18. The integrated semiconductor component of claim 15, wherein the second extension direction is a lateral extension direction, in particular with respect to the semiconductor material region in which the integrated semiconductor component is formed.

19. The integrated semiconductor component of claim 15, wherein the second extension direction is a vertical extension direction, in particular with respect to the semiconductor material region in which the integrated semiconductor component is formed.

* * * * *